United States Patent
Wang et al.

(10) Patent No.: US 9,007,733 B2
(45) Date of Patent: Apr. 14, 2015

(54) TRAVELLING-WAVE BASED FAULT PROTECTION OF HIGH-VOLTAGE TRANSMISSION LINES

(75) Inventors: Jianping Wang, Västerås (SE); Jiuping Pan, Raleigh, NC (US); Reynaldo Nuqui, Cary, NC (US)

(73) Assignee: ABB Technology AG, Zürich (CH)

( * ) Notice: Subject to any disclaimer, the term of this patent is extended or adjusted under 35 U.S.C. 154(b) by 0 days.

(21) Appl. No.: 14/355,449

(22) PCT Filed: Nov. 1, 2011

(86) PCT No.: PCT/EP2011/069187
§ 371 (c)(1),
(2), (4) Date: Apr. 30, 2014

(87) PCT Pub. No.: WO2013/064176
PCT Pub. Date: May 10, 2013

(65) Prior Publication Data
US 2014/0254053 A1    Sep. 11, 2014

(51) Int. Cl.
*H02H 3/00*       (2006.01)
*G01R 31/08*      (2006.01)
*H02H 7/26*       (2006.01)

(52) U.S. Cl.
CPC ............ *G01R 31/088* (2013.01); *G01R 31/085* (2013.01); *H02H 7/265* (2013.01)

(58) Field of Classification Search
USPC ........................................................ 361/62
See application file for complete search history.

(56) References Cited

U.S. PATENT DOCUMENTS

| | | | | |
|---|---|---|---|---|
| 4,183,072 A * | 1/1980 | Takagi et al. | | 361/68 |
| 4,719,580 A * | 1/1988 | Nimmersjo | | 702/59 |
| 5,796,630 A * | 8/1998 | Maeda et al. | | 361/160 |
| 8,749,933 B2 * | 6/2014 | Berggren et al. | | 361/65 |
| 8,873,307 B2 * | 10/2014 | Kajigaya | | 365/189.05 |

FOREIGN PATENT DOCUMENTS

EP        0 227 017 A2      7/1987

OTHER PUBLICATIONS

Christopoulos et al., "Signal Processing and Discriminating Techniques Incorporated in a Protective Scheme Based on Travelling Waves", IEEE Proceedings, Sep. 5, 1989, pp. 279-288, vol. 136, Pt. C, No. 5.

* cited by examiner

*Primary Examiner* — Stephen W Jackson
(74) *Attorney, Agent, or Firm* — Birch, Stewart, Kolasch & Birch, LLP

(57) ABSTRACT

An improved method of fault detection in a high-voltage direct current (HVDC) power transmission line is provided. The fault detection is based on fault-induced travelling waves. The method comprises estimating an amplitude of fault-induced travelling waves at the fault location, and calculating a fault resistance ($R_f$) based on the estimated amplitude, an estimated pre-fault voltage at the fault location, and a surge impedance of the transmission line. The estimated fault amplitude and the estimated pre-fault voltage are calculated from voltage measurements performed at both ends of the transmission line. Further, a fault detection device is provided.

6 Claims, 2 Drawing Sheets

TRAVELLING-WAVE BASED FAULT PROTECTION OF HIGH-VOLTAGE TRANSMISSION LINES

FIELD OF THE INVENTION

The invention relates in general to high-voltage power transmission, and more specifically to fault protection of high-voltage direct current (HVDC) transmission lines based on travelling waves.

BACKGROUND OF THE INVENTION

In HVDC transmission lines, different types of protection mechanisms may be used in order to detect faults over a broad impedance range. For instance, main protection functions may be employed for covering transmission line faults having impedances in the low-impedance range, i.e., up to 20 Ohm. Line differential protections functions, on the other hand, typically provide a higher sensitivity, allowing to cover faults with impedances up to 400 Ohm.

Since known fault protections techniques for HVDC transmission lines have a limited sensitivity, and, hence, are only capable of detecting faults within a limited impedance range, a fault protection mechanism suitable for high-impedance faults is desirable.

SUMMARY OF THE INVENTION

It is an object of the present invention to provide a more efficient alternative to the above techniques and prior art.

More specifically, it is an object of the present invention to provide an improved fault detection for high-voltage transmission lines, in particular HVDC transmission lines. It is a further object of the invention to provide an improved detection of high-impedance faults.

These and other objects of the present invention are achieved by means of a method of fault detection having the features defined in independent claim 1, and by means of a fault detection device defined in independent claim 6. Embodiments of the invention are characterized by the dependent claims.

According to a first aspect of the invention, a method of fault detection in a high-voltage power transmission line is provided. The method comprises estimating a voltage amplitude $V_f$ of a fault-induced travelling wave, and calculating a fault resistance $R_f$. The amplitude of the fault-induced travelling wave at the fault-location is estimated. The fault resistance is calculated based on the estimated amplitude, an estimated pre-fault voltage $V_0$, and a surge impedance $Z_0$ of the transmission line. The pre-fault voltage at the fault location is estimated.

According to a second aspect of the invention, a fault detection device is provided. The fault detection device comprises estimating means and calculating means. The estimating means is arranged for estimating a voltage amplitude $V_f$ of a fault-induced travelling wave. The amplitude of the fault-induced travelling wave at the fault-location is estimated. The calculating means is arranged for calculating a fault resistance $R_f$. The fault resistance is calculated based on the estimated amplitude, an estimated pre-fault voltage $V_0$, and a surge impedance $Z_0$ of the transmission line. The pre-fault voltage at the fault location is estimated.

The present invention makes use of an understanding that high-impedance faults in high-voltage power transmission lines may be detected by way of travelling waves which are created by such faults. To this end, a fault occurring on a transmission line creates travelling waves which propagate towards the ends of the transmission line. The amplitude of the fault-induced travelling waves, at the fault location, is related to the fault resistance, by $$V_f = V_0 \frac{Z_0}{Z_0 + 2R_f}$$

(see, e.g., A. Wright and C. Christopoulos, *Electrical power system protection*, Chapman & Hall, 1993). By measuring the fault-induced change in voltage at both ends of the transmission line, an estimate of the original amplitude of the traveling wave at the fault location may be obtained. Subsequently, the impedance of the fault may be calculated, based on the estimated travelling wave amplitude. This is advantageous in that high-impedance faults can be detected without having access to the fault location which may be spread randomly along the transmission line.

According to an embodiment of the invention, the fault resistance $R_f$ is calculated as $$R_f = Z_0 \frac{V_0 - V_f}{2V_f}.$$

Calculating the fault resistance is advantageous in that conclusions about the nature of a fault may be drawn from the calculated fault resistance.

According to an embodiment of the invention, the pre-fault voltage $V_0$ at the fault location is estimated by measuring a first pre-fault voltage $V_0^A$ and a second pre-fault voltage $V_0^B$. Further, the amplitude $V_f$ of the fault-induced travelling wave at the fault location is estimated by measuring a first fault-induced voltage change $\Delta V^A$ and a second fault-induced voltage change $\Delta V^B$. The first pre-fault voltage and the first fault-induced voltage change are measured at a first end of the transmission line. The second pre-fault voltage and the second fault-induced voltage change are measured at a second end of the transmission line. The estimated pre-fault voltage is calculated as $$V_0 = \frac{V_0^A + V_0^B}{2}.$$

The estimated amplitude of the fault-induced travelling wave is calculated as $V_f = \Delta V^A + \Delta V^B$. Estimating the amplitude of the travelling wave, and the pre-fault voltage, at the fault location by means of measurements performed at both ends of the transmission line is advantageous in that estimates for the two values may be obtained without performing measurements at the fault location. This is of particular importance since the fault may occur anywhere along the transmission line. Using measured values from both ends of the transmission line, instead of using measured values from either of the ends, results in a better estimate of the fault resistance.

According to an embodiment of the invention, the method further comprises comparing the calculated fault resistance to a threshold value, and deciding that a high-impedance fault has occurred if the calculated fault resistance exceeds the threshold value. By comparing the calculated fault resistance to one, or several, threshold values, the fault may be categorized according to different fault types, such as high-impedance faults.

According to an embodiment of the invention, the method further comprises initiating protective measures. The protective measures are initiated in response to deciding that a high-impedance fault has occurred. This is advantageous in that protective measures may be initiating dependent on the nature of the fault. For instance, an embodiment of the invention may be used to initiate protective measure, such as tripping a circuit breaker, for high-impedance faults only.

Even though advantages of the present invention have in some cases been described with reference to embodiments of the method according to the first aspect of the invention, corresponding reasoning applies to embodiments of the device according to the second aspect of the invention.

Further objectives of, features of, and advantages with, the present invention will become apparent when studying the following detailed disclosure, the drawings and the appended claims. Those skilled in the art realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention, with reference to the appended drawings, in which.

All the figures are schematic, not necessarily to scale, and generally only show parts which are necessary in order to elucidate the invention, wherein other parts may be omitted or merely suggested.

DETAILED DESCRIPTION

Figure 1:
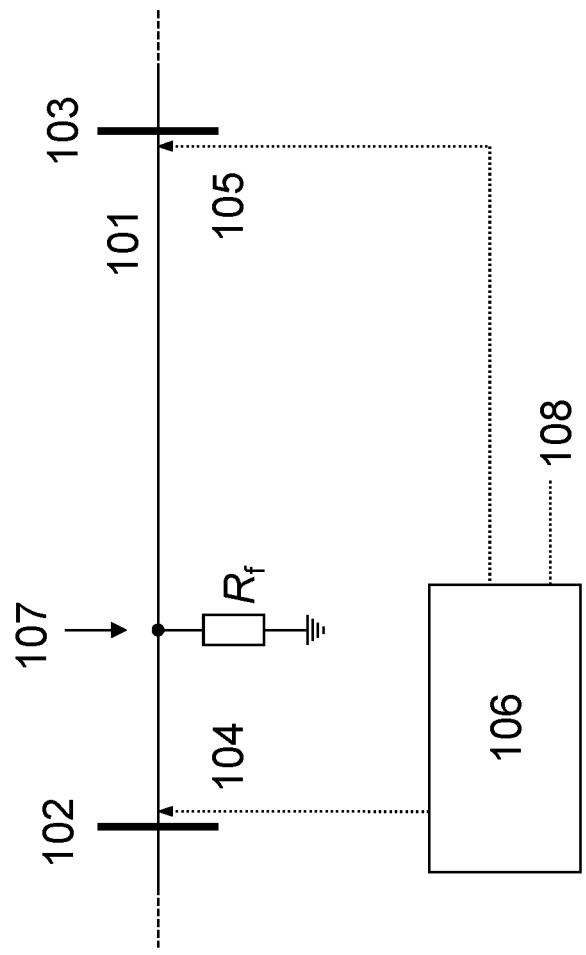
FIG. 1 illustrates an HVDC transmission line in accordance with an embodiment of the invention.

With reference to FIG. 1, an embodiment of the invention is illustrated.

FIG. 1 illustrates a high-voltage transmission line 101, e.g., an HVDC transmission line, for transmitting power between two ends 102 and 103 of transmission line 101. Transmission line ends 102 and 103 are provided with voltage sensors 104 and 105, respectively, for measuring the voltage of transmission line 101 at either ends 102 and 103. Voltage sensors 104 and 105 are connected to a fault detection device 106 which is arranged for detecting faults on transmission line 101.

In the event of a fault on transmission line 101, travelling waves are created at the fault location 107. The travelling waves propagate in both directions along transmission line 101. Fault detection device 106 is arranged for detecting a change in voltage upon the arrival of the travelling waves at ends 102 and 103 of transmission line 101. To this end, voltage sensor 104 is arranged for detecting a change in voltage $\Delta V^A$ at the first end 102 of transmission line 101, and voltage sensor 105 is arranged for detecting a change in voltage $\Delta V^B$ at the second end 103 of transmission line 101. Voltage sensors 104 and 105 are further arranged for measuring pre-fault voltages $V_0^A$ and $V_0^B$, i.e., the voltages under normal operation in absence of a fault, at ends 102 and 103.

Fault detection device 106 is further arranged for calculating, in response to detecting the arrival of a travelling wave at ends 102 and 103 of transmission line 101, the resistance $R_f$ of fault 107. This is performed by calculating an estimate of the fault-induced travelling wave amplitude $V_f$, and subsequently calculating the fault resistance $R_f$ based on the estimated travelling-wave amplitude $V_f$, an estimate of the pre-fault voltage $V_0$, and a surge impedance $Z_0$ of transmission line 101.

More specifically, the estimate of the pre-fault voltage $V_0$ at the fault location is calculated as $$V_0 = \frac{V_0^A + V_0^B}{2},$$

i.e., as an average of the pre-fault voltages $V_0^A$ and $V_0^B$ measured at ends 102 and 103, respectively. Correspondingly, the estimate of the travelling wave voltage amplitude $V_f$ is calculated as $V_f = \Delta V^A + \Delta V^B$, i.e., as an average of the fault-induced voltage changes $\Delta V^A$ and $\Delta V^B$ measured at ends 102 and 103, respectively. Finally, the fault resistance $R_f$ is calculated as $$R_f = Z_0 \frac{V_0 - V_f}{2V_f}.$$

Fault detection device 106 may further be arranged for comparing the calculated fault resistance to a threshold, for the purpose of categorizing the fault, or for deciding whether to initiate protective measures or not. For instance, fault detection device 106 may be arranged for initiating protective measures, such as sending a trip signal 108 to circuit breakers located at either end of transmission line 101, only in the event that the calculated fault resistance exceeds a certain threshold. In this way, protective measures are only initiated if a high-impedance fault is detected.

Figure 2:
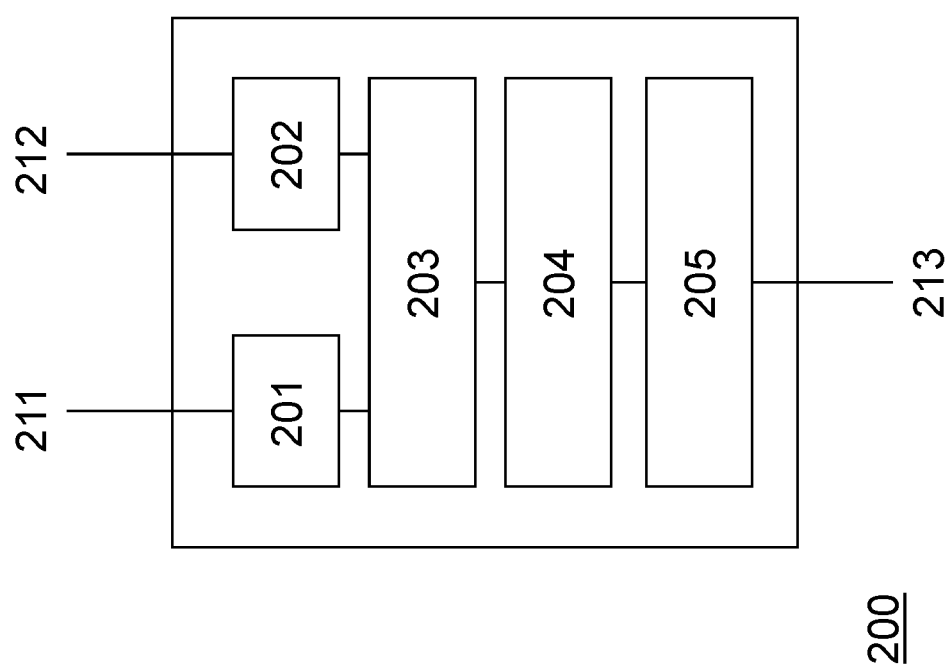
FIG. 2 illustrates a fault detection device in accordance with an embodiment of the invention.

In FIG. 2, an embodiment of the fault detection device, such as fault detection device 106 described with reference to FIG. 1, is illustrated.

Fault detection device 200 comprises first means 201 for measuring the voltage at a first end of a transmission line, second means 202 for measuring the voltage at a second end of a transmission line, estimating means 203, calculating means 204, and comparing means 205. First 201 and second 202 voltage measuring means may, e.g., be arranged for using voltage sensors 211 and 212, such as voltage sensors 104 and 105 described with reference to FIG. 1. Estimating means 203 is arranged for estimating, as was described with reference to FIG. 1, the pre-fault voltage $V_0$ as well as the amplitude $V_f$ of the fault-induced travelling wave based on voltage measurements performed by first 201 and second 202 voltage measuring means. Calculating means 204 is arranged for calculating, based on the estimated pre-fault voltage $V_0$, the estimated travelling wave amplitude $V_f$, as well as the surge impedance $Z_0$ of transmission line 101, the fault resistance $R_f$, as was described hereinbefore. Comparing means 205 is arranged for comparing the calculated fault resistance $R_f$ to a threshold value, and sending, in the event that the calculated fault resistance $R_f$ exceeds the threshold value, a trip signal 213 to circuit breakers located at either end of transmission line 101. Alternatively, fault detection device 200 may be arranged for sending a fault indication signal 213 to an external fault protection system. As a further alternative, embodiments of fault detection device 200 may be arranged at either end of transmission line 101, with means for communicating their respective measurement results to the fault detection device located at the other end of transmission line 101. In this way, each fault detection device may be arranged for evaluating the occurrence of a fault based on its own measurement and the measurement results received from the fault detection device located at the other end, and for tripping a local circuit breaker in response to detecting a fault.

It will be appreciated by the person skilled in the art that estimating means 203, calculating means 204, and comparing means 205, may be implemented by electronic components, integrated circuits (IC), application specific integrated circuits (ASIC), field programmable gate arrays (FPGA), and/or complex programmable logic devices (CPLD), or any combination thereof. It will also be appreciated that the corresponding functionality can, at least in part, be replaced by processing means, e.g., a processor executing an appropriate software.

The person skilled in the art realizes that the present invention by no means is limited to the embodiments described above. On the contrary, many modifications and variations are possible within the scope of the appended claims. For example, the present invention is not limited to fault detection in HVDC transmission lines, but embodiments of the invention providing fault detection in high voltage alternating current (AC) transmission lines may easily be envisaged. Further, an embodiment of the invention may be integrated with an existing fault protection system.

In conclusion, an improved method of fault detection in an HVDC power transmission line is provided. The fault detection is based on fault-induced travelling waves. The method comprises estimating an amplitude of fault-induced travelling waves at the fault location, and calculating a fault resistance based on the estimated amplitude, an estimated pre-fault voltage at the fault location, and a surge impedance of the transmission line. The estimated fault amplitude and the estimated pre-fault voltage are calculated from voltage measurements performed at both ends of the transmission line. Further, a fault detection device is provided.

The invention claimed is:

1. A method of fault detection in a high-voltage power transmission line, the method comprising:
    estimating a pre-fault voltage $V_0$ at a fault location of the high-voltage power transmission line by:
        measuring a first pre-fault voltage $V_0^A$ at a first end of the transmission line,
        measuring a second pre-fault voltage $V_0^B$ at a second end of the transmission line, and
        calculating the estimated pre-fault voltage as $$V_0 = \frac{V_0^A + V_0^B}{2},$$

estimating a voltage amplitude $V_f$ at the fault location, of a fault-induced travelling wave by:
        measuring a first fault-induced voltage change $\Delta V^A$ at the first end of the transmission line,
        measuring a second fault-induced voltage change $\Delta V^B$ at the second end of the transmission line, and
        calculating the estimated amplitude of the fault-induced travelling wave as $V_f = \Delta V^A + \Delta V^B$, and
    calculating a fault resistance $R_f$ based on the estimated amplitude $V_f$, the estimated pre-fault voltage $V_0$ at the fault location, and a surge impedance $Z_0$ of the transmission line as $$R_f = Z_0 \frac{V_0 - V_f}{2V_f}.$$

2. The method according to claim 1, further comprising:
    comparing the calculated fault resistance to a threshold value, and
    deciding that a high-impedance fault has occurred if the calculated fault resistance exceeds the threshold value.

3. The method according to claim 2, further comprising:
    initiating, in response to deciding that a high-impedance fault has occurred, protective measures.

4. A fault detection device comprising:
    first measuring means being arranged for measuring, at a first end of a high-voltage power transmission line, a first pre-fault voltage $V_0^A$ and a first fault-induced voltage change $\Delta V^A$, and
    second measuring means being arranged for measuring, at a second end of the transmission line, a second pre-fault voltage $V_0^B$ and a second fault-induced voltage change $\Delta V^B$,
    estimating means being arranged for estimating a voltage amplitude $V_f$ at a fault location of the high-voltage power transmission line, of a fault-induced travelling wave by calculating an estimated amplitude of the fault-induced travelling wave as $V_f = \Delta V^A + \Delta V^B$, the estimating means being further arranged to calculate an estimated pre-fault voltage as $$V_0 = \frac{V_0^A + B_0^B}{2},$$

and
    calculating means being arranged for calculating a fault resistance $R_f$ based on the estimated amplitude $V_f$, the estimated pre-fault voltage $V_0$ at the fault location, and a surge impedance $Z_0$ of the transmission line, the fault resistance $R_f$ being calculated as $$R_f = Z_0 \frac{V_o - V_f}{2V_f}.$$

5. The device according to claim 4, further comprising comparing means being arranged for:
    comparing the calculated fault resistance to a threshold value, and
    deciding that a high-impedance fault has occurred if the calculated fault resistance exceeds the threshold value.

6. The device according to claim 5, wherein the comparing means is further arranged for:
    initiating, in response to deciding that a high-impedance fault has occurred, protective measures.

* * * * *